US008206819B2

(12) United States Patent
Liu

(10) Patent No.: US 8,206,819 B2
(45) Date of Patent: Jun. 26, 2012

(54) VARNISH, PREPREG, AND SUBSTRATE THEREOF

(75) Inventor: Lai Tu Liu, Taoyuan (TW)

(73) Assignee: Iteq Corporation, Taoyuan (TW)

( * ) Notice: Subject to any disclaimer, the term of this patent is extended or adjusted under 35 U.S.C. 154(b) by 257 days.

(21) Appl. No.: 12/694,761

(22) Filed: Jan. 27, 2010

(65) Prior Publication Data

US 2011/0183144 A1 Jul. 28, 2011

(51) Int. Cl.

| | |
|---|---|
| ***B32B 27/38*** | (2006.01) |
| ***B32B 27/04*** | (2006.01) |
| ***C08L 63/00*** | (2006.01) |
| ***C08K 3/34*** | (2006.01) |

(52) U.S. Cl. ............... 428/301.4; 428/297.4; 428/300.7; 428/413; 428/414; 428/901; 523/443; 523/466

(58) Field of Classification Search ............... 428/297.4, 428/413, 414, 415, 416, 417, 418, 901, 300.7, 428/301.4; 523/443, 466

See application file for complete search history.

(56) References Cited

U.S. PATENT DOCUMENTS

| | | | | |
|---|---|---|---|---|
| 4,529,790 | A * | 7/1985 | Kamio et al. | 528/107 |
| 5,089,543 | A * | 2/1992 | Kurio et al. | 523/466 |
| 2010/0092764 | A1 * | 4/2010 | Chung et al. | 428/331 |

FOREIGN PATENT DOCUMENTS

| | | | |
|---|---|---|---|
| GB | 2083478 | A * | 3/1982 |

* cited by examiner

*Primary Examiner* — Michael J Feely

(74) *Attorney, Agent, or Firm* — Kile Goekjian Reed & McManus PLLC

(57) ABSTRACT

A varnish includes an epoxy resin, a curing agent, an accelerator agent and fillers. The fillers include inorganic mineral powders. The inorganic mineral powders have composition of $SiO_2$ in weight ratio of 55±5% and a composition of aluminum compound in weight above 35%. Glass fabric cloth is dipped into the varnish so as to form a prepreg with better machined-work capability.

18 Claims, No Drawings

VARNISH, PREPREG, AND SUBSTRATE THEREOF

BACKGROUND OF THE INVENTION

1. Field of the Invention

The present invention relates to a varnish and a prepreg, in particular to a varnish containing with inorganic mineral powders, a prepreg made from the varnish, and a substrate made from the prepreg.

2. Description of Related Art

A Printed Circuit Board (PCB) is made by laminating and curing the prepregs, copper clad laminate (CCL), or copper film. The prepregs are generally made by dipping glass fabrics into vanish and then curing the fabrics to form thin prepregs. Regarding environmental protection (such as RoHS, WEEE), lead-free solder is more and more widely used for electronic application. However, the process temperature is increased in 30 to 40° C. for the lead-free solder processes and it is necessary to improve the heatproof property of the PCBs so that the PCBs can be used in higher temperature process Traditionally, the inorganic fillers and fillers of the anti-flammability such as SiO2 and aluminium hydroxide powders are added into the varnish to improving the heat-proof and anti-flammability of the prepregs/substrates. However, the above-mentioned powders are harder materials and the manufactured prepregs/substrates are too hard and brittle to be machined. For example, while drilling on the hard and brittle substrates, the surfaces of the drilled holes are roughness, or the laminated layers of the substrate are de-laminated. There are some cracks inside the substrate. On the other hand, the drill bit is easily broken and the manufacturing cost is increased.

On the other hand, the smaelite powders which is often used for manufacturing insulating layer of the electrical wires are also applied to the varnish. Generally, the smaelite powders not only have SiO2 but also aluminum compound in weight above 30% to improve the properties of heat-proof and anti-flammability of the prepregs/substrates. Furthermore, the smaelite powders are softer materials so that the manufactured prepregs/substrates have improved machining properties comparing to the prepregs/substrates manufactured the varnish having higher fillers of SiO2. Thus, the drilled holes have smooth surface and have no cracks thereon. However, the smaelite powders have less composition of SiO2 (less than 40%) and the electrical properties such as of Dk, Df of the prepregs/substrates cannot meet the requirement of applications. In addition, the peeling strength of the laminated substrates is decreased.

Still further, talcum powders can be used as fillers to improve the electrical properties such as of Dk, Df of the prepregs/substrates for the communication application. Talcum powders have high composition of SiO2 and composition of magnesium oxide. The composition of magnesium oxide can be provided for improve the anti-flammability of the prepregs/substrates. However, magnesium oxide materials are condensed and suspended in the alkaline solution. Thus, talcum powders merely can be used in a varnish with limited condition. In other words, the talcum powders cannot be used in general applications.

Therefore, in view of these difficulties, the inventor has developed ways to overcome these difficulties to yield dependable product with reliable results in production; the present invention addresses these difficulties and allows reliable production at high speed and overcomes the above problems.

SUMMARY OF THE INVENTION

The primary objective of the present invention is to provide for a varnish having useful properties for electronics use. The varnish contains fillers which have inorganic mineral powders (such as mica powders) and the inorganic mineral powders are used for improving the machining property of the prepregs/substrates. The compositions of SiO2 and aluminum compound of the inorganic mineral powders, and the compositions of metal oxides of alkali metals and metal oxides of alkali-earth metals are controlled to avoid any detrimental reactions. In other words, the prepregs made by the varnish has improved characteristics of short gelation time, high anti-flammability, high heatproof, and low moisture absorption.

To achieve the above-mentioned objective, the present invention provides a varnish. The varnish includes composition (A): an epoxy resin, composition (B): a curing agent, composition (C): an accelerator, and composition (D): fillers, wherein the fillers are inorganic mineral powders, the inorganic mineral powders have a composition of SiO2 in weight of 55±5%, and a composition of aluminum compound in weight above 35%.

The present invention provides a varnish which, when used properly will yield a prepreg which is manufactured by dipping the glass fabrics into the varnish and then curing and drying the dipped fabrics.

The present invention further provides a substrate by laminating the prepreg into the substrate for a PCB.

The inorganic mineral powders having a composition of SiO2 in weight of 55±5%, and a composition of aluminum compound in weight above 35% are added into the varnish and the softer inorganic mineral fillers can be provided for improving the machining property of the prepregs/substrates. The compositions of metal oxides of alkali metals and metal oxides of alkali-earth metals of the sericite powders are studied to control the chemical characteristics of the varnish.

In order to further understand the techniques, means, and effects the present invention takes for achieving the prescribed objectives, the following detailed descriptions and appended drawings are hereby referred, such that, through which, the purposes, features, and aspects of the present invention can be thoroughly and concretely appreciated; however, the appended drawings are provided solely for reference, demonstration, clarity and illustration, without intent that they will be used for limiting the present invention.

DETAILED DESCRIPTION OF THE PREFERRED EMBODIMENTS

The present invention provides a varnish which includes fillers of inorganic mineral powders. The varnish with the inorganic mineral powders is used for dipping glass fibers for improving the machining property of the prepregs/substrates so as to avoid the crack while drilling on the prepregs/substrates. Moreover, the anti-flammability of the prepregs/substrates has been improved.

In other words, the inorganic mineral powders with predetermined ratio of components are provided. In the present invention, the amount of SiO2 represents the amount of Si component, and the amount of aluminum compound (as shown by formula: Al2O3) represents the amount of aluminum hydroxide, aluminum hydroxide with crystal water, aluminum oxide or aluminum oxide with crystal water. On the other hand, the weight ratio of SiO2 is ranged in 55±5% to control the hardness of the inorganic mineral powders so that the inorganic mineral powders are suitable as the fillers in the varnish. Therefore, the inorganic mineral powders with soft hardness are provided for decreasing the cracks while drilling on the manufactured prepregs/substrates. Moreover, the weight ratio of Al2O3 (i.e., aluminum compound) is equal to or more than 35% so that the manufactured prepregs/substrates have high anti-flammability.

Some experiments are shown in Table. 1. The varnish of the present invention has composition (A): an epoxy resin, composition (B): a curing agent, composition (C): an accelerator, and composition (D): fillers of inorganic mineral powders. The compositions of the varnishes are shown in Table. 1. In Table. 1, the epoxy resin has the primary composition with 100 parts, the epoxy resin is one of or more than one of the brominated novolac epoxy resin, bisphenol-A novolac epoxy resin, and tetrafunctional epoxy resin (FR4 epoxy resin), but not restricted thereby. The curing agent of composition (B) is a phenol curing agent, for example a bisphenol-A novolac curing agent which has 30 parts relative to the primary parts (i.e., 100 parts) of the composition (A).

The compositions of the inorganic mineral powders are different in Embodiment 1 and Comparisons 1-4. For example, white mica powders are added in to the varnish as the fillers of inorganic mineral powders. Smaelite powders are added in to the varnish as the fillers in Comparisons 1-4. Traditional SiO2 powders are added in to the varnish as the fillers in Comparison 5. In addition, eight prepregs made by the Embodiment 1 and Comparisons 1-5 are respectively laminated with copper film of 1 oz to form the copper clad laminate (CCL) and then the CCLs are tested for the characteristics shown in Table. 1

As shown in Table. 1, the accelerator of composition (C) is a 2-ethyl-4-methylimidazole which has 0.1 parts relative to the primary parts (i.e., 100 parts) of the composition (A).

In addition, the varnish further has composition (E): additives. The additives can have one or more surfactant, such as a coupling agent or another additive. In the Embodiment 1 and Comparisons 1-4, the varnish has a silane coupling agent with 0.04 parts by weight relative to 100 parts by weight of the composition (A). The silane coupling agent is used in the varnish added with inorganic powders for improving the surface activity of the inorganic powders. Thus, the physical characteristics of the composite material, such as strength and wear-resistance, can be improved. The silane coupling agent has a silicone monomer with at least two different functional groups. One of the functional groups can be linked with the inorganic powders and the other functional group can be connected to the resin material. Therefore, the silane coupling agent is used for increasing the intimate attraction of the resin and the filled powders so as to improve the anti-flammability and machining properties.

On the other hand, the varnish further has solvent of composition (F) and the solvent has 100 parts relative to the primary parts of the composition (A). The solvent of composition (F) can be one of or more than one of methyl ethyl ketone (MEK), propylene glycol monomethyl ether (PM), and cyclohexanone. In the Embodiment 1 and Comparisons 1-4, PM is used as the solvent.

After manufacturing the prepregs by the varnish of the Embodiment 1 and Comparisons 1-4, eight prepregs made

TABLE 1

| | composition | parts | Example 1 | Comparison 1 | Comparison 2 | Comparison 3 | Comparison 4 |
|---|---|---|---|---|---|---|---|
| A: epoxy resin | brominated novolac epoxy resin, bisphenol-A novolac epoxy resin, tetrafunctional epoxy resin (FR4 epoxy resin) | primary part | 100 | 100 | 100 | 100 | 100 |
| B: phenol curing agent | bisphenol-A novolac curing agent | relative part | 30 | 30 | 30 | 30 | 30 |
| C: accelerator | 2-ethyl-4-methylimidazole | relative part | 0.1 | 0.1 | 0.1 | 0.1 | 0.1 |
| E: silane coupling agent | Silane coupling agent | relative part | 0.04 | 0.04 | 0.04 | 0.04 | 0.04 |
| F: solvent | PM | relative part | 100 | 100 | 100 | 100 | 100 |
| filler 1 | White mica powders ($SiO_2$ 55 ± 5%, Al2O3 > 35%, Na2O < 3%. K2O < 3%, particle size 2 ± 1 um) | relative part | 30 | — | — | — | — |
| filler 2 | Smaelite powders ($SiO_2$ 45%, Al2O3 38%) | relative part | — | 30 | — | — | — |
| filler 3 | Smaelite powders ($SiO_2$ 75%, Al2O3 15%) | relative part | — | — | 30 | — | — |
| filler 4 | Smaelite powders ($SiO_2$ 45%, Al2O3 31%, Na2O > 10%, K2O > 10%) | relative part | — | — | — | 30 | — |
| filler 5 | quartz powders ($SiO_2$ > 99%) | relative part | — | — | — | — | 30 |
| | Testing items | unit | Example 1 | Comparison 1 | Comparison 2 | Comparison 3 | Comparison 4 |
| Sample test | Tg | ° C. | 158.5 | 132 | 141 | 152.5 | 158.6 |
| | gelation time | sec | 85 | 84 | 85 | 130 | 86 |
| | peeling strength | lbs/inch | 8.5 | 7.9 | 8.0 | 6.5 | 8.2 |
| | moisture absorption | % | 0.47 | 0.58 | 0.50 | 0.62 | 0.48 |
| | float at 288° C. | min | >10 | >8 | >8 | <6 | >10 |
| | UL 94 | | V-0 | V-0 | V-0 | V-0 | V-0 |
| | Dk | | 4.65 | 4.71 | 4.60 | 4.75 | 4.21 |
| | Df | | 0.017 | 0.019 | 0.016 | 0.019 | 0.013 |
| | Crack amounts in 27 drilled holes | | 0 | 0 | 3 | 0 | 15 |

respectively by Embodiment 1 and Comparisons 1-4 are laminated with copper film of 1 oz to form the copper clad laminate (CCL) and then the CCLs are tested for the characteristics, such as gelation time, moisture absorption and anti-flammability shown in Table. 1.

The moisture absorption (i.e., water absorption) is determined by the water or moisture within the prepregs/CCLs. The moisture absorption of the prepregs/CCLs has to be controlled for preventing the situation of de-lamination. In general, the prepregs/CCLs are inspected by infrared (IR) or thermogravimetric analysis so as to determine the degree of moisture absorption.

The result of solder float resistance: the solder float test follows the instruction of IPC-TM-650 Method 2.4.13.1. The method tests heat-dissipation prepregs/CCLs in 288° C. and measures the time of the prepregs/CCLs failure (De-lamination):

The test of anti-flammability follows the instruction of UL 94 method. According to the degree of the anti-flammability, the testing results are rated as HB, V-2, V-1, V-0, and 5V so as to represent the anti-flammability of prepregs/CCLs. The testing prepreg is burned on the fire vertically and follows the following steps. Step 1 is burning the prepreg/CCL in fire for 10 seconds and then moving the prepreg/CCL away, and simultaneously counting the time period (T1) that the prepreg/CCL continues to burn after being removed from the fire. Step 2 is burning the prepreg/CCL in fire for 10 seconds again, then moving the prepreg/CCL away and simultaneously counting the time period (T2) that the prepreg/CCL continues to burn after being removed from the fire. Step 3 is repeating the steps 1 and 2, and calculating the mean value of T1 and T2. Step 4 is summing T1 and T2. According to the specific definition of UL 94, V-0, neither of the mean value of T1 and T2 is larger than 10 seconds, and the sum of T1 and T2 is no greater than 50 seconds.

The machining property: the prepreg/CCL is drilled thereon and then counting the amounts of the drilled holes with cracks per 27 holes. The less amounts of the holes with cracks means that the prepreg/CCL has better machining property.

In Table. 1, the Embodiment 1 is a preferable embodiment of the present invention. The inorganic mineral fillers are mica powders (i.e., white mica powders) which have a formula of R1R2[AlSi3O10](OH)2, and R1, R2 are metal ions, for example, sodium ion, potassium ion, or magnesium ion. The composition of SiO2 in the mica powders of the Embodiment 1 is 55±5% and the particle size of the mica powders is ranged 2±1 um.

According to the experimental data of Embodiment 1, the gelation time, the peeling strength and the moisture absorption of the prepreg/CCL of Embodiment 1 can meet the requirement of the product applications. Tg of the prepreg/CCL is analyzed about 158.5° C. and the high Tg means the reactivity manufactured prepregs/CCLs are improved. On the other hand, the result of Embodiment 1 presents that the de-lamination time of the prepreg/CCL of Embodiment 1 meets the requirement of the heatproof property (i.e., more than 10 minutes). Moreover, the drilled holes have no crack thereon. Due to the softer powders with limited composition of SiO2 (Mohs' scale of hardness of the powders is smaller than 3) added into the varnish, the machining property of the prepreg/CCL of Embodiment 1 is improved so as to avoid the crack of the drilled holes.

On other hand, the composition of aluminum compound (including aluminum hydroxide, aluminum hydroxide with crystal water, aluminum oxide or aluminum oxide with crystal water) is above 35% so that the manufactured prepregs/CCLs have improved anti-flammability (marked as V-0 degree).

Furthermore, the mica powders has metal oxides of alkali metals with weight ratio lower than 5%, and has metal oxides of alkali-earth metals with weight ratio lower than 5% (such as sodium oxide, potassium oxide, or magnesium oxide) to avoid the reaction between the powders and the components of the varnish. In the Embodiment 1, the weight ratios of Na2O and K2O are limited as smaller than 3% to any detrimental reaction between the resin and the added powders.

In Comparison 1, the fillers are smaelite powders or kaolinite powders having SiO2 in weight ratio smaller than 45%. Comparing with Comparison 1 and Embodiment 1, the prepregs/CCLs of Comparison 1 has lower peeling strength and lower heatproof property (i.e., the result of solder float resistance). The lower peeling strength and lower heatproof property are resulted from the less composition of SiO2 of the fillers. Further due to the less composition of SiO2, the Dk and the Df (dissipation factor) are too low to meet the electronic requirements. In addition, another physical property such as the moisture absorption or the reactivity (referred to the value of Tg) is out of the specifications of the product application.

In Comparison 2, the fillers are smaelite powders having higher SiO2 in weight ratio of 75% and lower aluminum compound in weight ration of 15%. Comparing with Comparison 2 and Embodiment 1, there are cracks formed in the drilled holes because of the higher hardness of the manufactured prepregs/CCLs, which is resulted from the harder smaelite powders with high composition of SiO2. Although the anti-flammability is marked as V-0 degree, the burning time period is close to the limitation of the V-0 degree. In other words, the lower composition of the aluminum compound results in the lower anti-flammability of the prepregs/CCL s.

In Comparison 3, the fillers having metal oxides of alkali metals (Na2O, K2O) in weight ratio larger than 10%. Comparing with Comparison 3 and Embodiment 1, the prepregs/CCLs of Comparison 3 has longer gelation time. The curing time is interfaced by the high activity of the fillers of Comparison 2 so that the longer gelation time. Thus, the curing reaction of the prepregs/CCLs is decreased. On the other hand, the peeling strength and the heatproof property of the prepregs/CCLs of Comparison 3 is too low (according to the solder float test) and the moisture absorption of the prepregs/CCLs of Comparison 3 is too high.

In Comparison 4, the traditional quartz powders having SiO2 in weight ratio above 99% are added into the resin. Comparing with Comparison 4 and Embodiment 1, the general properties of the prepregs/CCLs can meet the product application, but the drilled holes have lots of cracks. In other words, the traditional harder quartz powders cannot improve the machining property of the prepregs/CCLs.

Therefore, the fillers of the present invention are not restricted to the mica powders. In the case that the smaelite powders of Comparisons 1-3 have similar compositions of Embodiment 1, the modified smaelite powders also can be applied in the present invention.

A method for manufacturing a prepreg using the varnish is disclosed in the present invention. The varnish is provided and the varnish has composition (A): an epoxy resin, composition (B): a curing agent, composition (C): an accelerator, and composition (D): fillers which includes inorganic mineral powders, the inorganic mineral powders have a composition of SiO2 in weight of 55±5%, and a composition of aluminum compound in weight above 35%. The glass fabrics are dipped into the varnish so as to manufacture a prepreg, PP, or copper clad laminate (CCL) with good machining properties. The above-mentioned prepregs are applied for manufacturing the substrate of PCB, and the substrate has improved machining properties. For example, after drilling on the substrate, the drilled holes have smooth inner surfaces (i.e., with no cracks thereon).

In summary, the present invention has the following advantages.

1. The inorganic mineral powders with a composition of $SiO_2$ in weight of 55±5% are added into the varnish and the softer fillers can be provided for improving the machining property of the prepregs/substrates.

2. The composition of the aluminum compound is controlled equal to or higher than 35% to improve the anti-flammability of the prepregs/substrates. On the other hand, the compositions of the metal oxides of alkali metals and the metal oxides of alkali-earth metals are controlled to avoid the detrimental reaction between the resin and the added powders, and to maintain the stability of the varnish. Furthermore, the properties of the prepregs/substrates, such as moisture absorption and heatproof, can be meet the requirement of applications.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A varnish, comprising:

composition (A): an epoxy resin;

composition (B): a curing agent;

composition (C): an accelerator;

composition (D): fillers, wherein the fillers are mica powders, the mica powders comprising 55±5 weight % of a composition of $SiO_2$ and above 35 weight % of a composition of aluminum compound; and composition (F): a solvent.

2. The varnish according to claim 1, wherein the mica powders further comprise lower than 5 weight % of metal oxides of alkali metals and lower than 5 weight % of metal oxides of alkali-earth metals.

3. The varnish according to claim 1, wherein the mica powders have a formula of $R^1R^2[AlSi_3O_{10}](OH)_2$, wherein $R^1$ and $R^2$ are metal ions.

4. The varnish according to claim 3, wherein $R^1$ and $R^2$ are ions of sodium, potassium, or magnesium.

5. The varnish according to claim 1, wherein the mica powders of composition (D) are present in an amount of 30 parts by weight relative to 100 parts by weight of the composition (A).

6. The varnish according to claim 1, wherein the mica powders of composition (D) have a particle size of 2±1 μm.

7. The varnish according to claim 1, wherein the aluminum compound is aluminum hydroxide, aluminum hydroxide with crystal water, aluminum oxide or aluminum oxide with crystal water.

8. The varnish according to claim 1, wherein the epoxy resin of the composition (A) is one of or more than one of brominated novolac epoxy resin, bisphenol-A novolac epoxy resin, and tetrafunctional epoxy resin.

9. The varnish according to claim 1, wherein the curing agent of the composition (B) is a phenol curing agent.

10. The varnish according to claim 9, wherein the phenol curing agent is a bisphenol-A novolac curing agent.

11. The varnish according to claim 10, wherein the bisphenol-A novolac curing agent is present in an amount of 30 parts by weight relative to 100 parts by weight of the composition (A).

12. The varnish according to claim 1, wherein the accelerator of the composition (C) is 2-ethyl-4-methylimidazole and the 2-ethyl-4-methylimidazole is present in an amount of 0.06 parts by weight relative to 100 parts by weight of the composition (A).

13. The varnish according to claim 1, further comprising composition (E): additives.

14. The varnish according to claim 13, wherein the additives include a surfactant.

15. The varnish according to claim 14, wherein the surfactant is a silane coupling agent, and the silane coupling agent is present in an amount of 0.04 parts by weight relative to 100 parts by weight of the composition (A).

16. The varnish according to claim 1, wherein the solvent of the composition (F) includes one of or more than one of methyl ethyl ketone, propylene glycol monomethyl ether and cyclohexanone, and composition (F) is present in an amount of 100 parts by weight relative to 100 parts by weight of the composition (A).

17. A prepreg manufactured by dipping glass fabrics into the varnish of claim 1.

18. A substrate of printed circuit board manufactured by laminating the prepreg of claim 17.

* * * * *